United States Patent [19]

Hertog

[11] Patent Number: 4,828,960
[45] Date of Patent: May 9, 1989

[54] REFLECTION LIMITING PHOTORESIST COMPOSITION WITH TWO AZO DYES

[75] Inventor: Craig Hertog, Crystal, Minn.

[73] Assignee: Honeywell Inc., Minneapolis, Minn.

[21] Appl. No.: 930,088

[22] Filed: Nov. 13, 1986

Related U.S. Application Data

[63] Continuation of Ser. No. 689,269, Jan. 7, 1985, abandoned.

[51] Int. Cl.$^4$ ............................................... G03C 1/60
[52] U.S. Cl. ................................. 430/191; 430/165; 430/270; 430/311; 430/326
[58] Field of Search ............... 430/191, 196, 311, 325, 430/326, 175, 270

[56] References Cited

U.S. PATENT DOCUMENTS

| | | | |
|---|---|---|---|
| 2,113,973 | 4/1938 | Addink | 88/1 |
| 3,517,192 | 6/1970 | Kinoshita et al. | 430/293 |
| 3,567,453 | 3/1971 | Borden | 430/191 |
| 3,588,215 | 6/1971 | Singh | 430/4 |
| 3,661,582 | 5/1972 | Broyde | 430/191 |
| 3,969,120 | 7/1978 | Idelson | 430/4 |
| 4,013,465 | 3/1977 | Clapham et al. | 430/11 |
| 4,211,834 | 7/1980 | Lapadula et al. | 430/296 |
| 4,229,520 | 10/1980 | Bratt et al. | 430/5 |
| 4,268,603 | 5/1981 | Sato | 430/196 |
| 4,282,314 | 8/1981 | Dinella et al. | 430/5 |
| 4,287,289 | 9/1981 | Sato | 430/196 |
| 4,311,773 | 1/1982 | Kaneko et al. | 430/196 |
| 4,320,940 | 3/1982 | Mueller et al. | 252/582 |
| 4,339,525 | 7/1982 | Bratt et al. | 430/5 |
| 4,349,619 | 9/1982 | Kamoshida et al. | 430/196 |
| 4,353,978 | 10/1982 | Leberzammer et al. | 430/302 |
| 4,362,809 | 12/1982 | Chen et al. | 430/165 |
| 4,369,239 | 1/1983 | Feinberg et al. | 430/5 |
| 4,370,405 | 1/1983 | O'Toole et al. | 430/166 |
| 4,403,029 | 9/1983 | Ward et al. | 430/258 |
| 4,414,314 | 11/1983 | Kaplan et al. | 430/311 |
| 4,575,480 | 3/1986 | Kotani et al. | 430/193 |
| 4,618,565 | 10/1986 | White et al. | 430/311 |

FOREIGN PATENT DOCUMENTS

| | | | |
|---|---|---|---|
| 1041463 | 4/1962 | United Kingdom | 430/191 |
| 1170458 | 2/1966 | United Kingdom | 430/191 |
| 1039475 | 8/1966 | United Kingdom | 430/191 |
| 1586574 | 3/1981 | United Kingdom | 430/175 |

OTHER PUBLICATIONS

Color Index, 3rd ed., vol. 4, 1973, pp. 4013, 4027, 4043.
Carlson, Robert et al., "Control of One Micron Lines in Integrated Circuits," Honeywell SSED, Plymouth, Minnesota.

Primary Examiner—Charles L. Bowers, Jr.
Attorney, Agent, or Firm—C. G. Mersereau

[57] ABSTRACT

A reflection limiting photoresist is disclosed.

3 Claims, 2 Drawing Sheets

REFLECTION LIMITING PHOTORESIST COMPOSITION WITH TWO AZO DYES

BACKGROUND AND SUMMARY OF THE INVENTION

The Government has rights in this invention pursuant to Contract No. F33615-81-C-1527 awarded by the Department of the Air Force.

This application is a continuation of application Ser. No. 689,269, filed Jan. 7, 1985, now abandoned.

Silicon wafers are coated with photoresist and exposed several times during the manufacture of integrated circuits. On some layers such as aluminum, there are reflections off the surface which result in fine lines disappearing. Standard photoresists are very susceptible to surface reflections which degrade or destroy the pattern created in the photoresist during exposure of the photoresist.

The present invention is a photoresist which was specially made to eliminate problems caused by reflections off the surface on which the photoresist is coated. In the preferred embodiment, two specially chosen dyes, Methyl Red and Sudan Orange G, are added directly to the photoresist.

DESCRIPTION OF THE PREFERRED EMBODIMENTS

Figure 1:
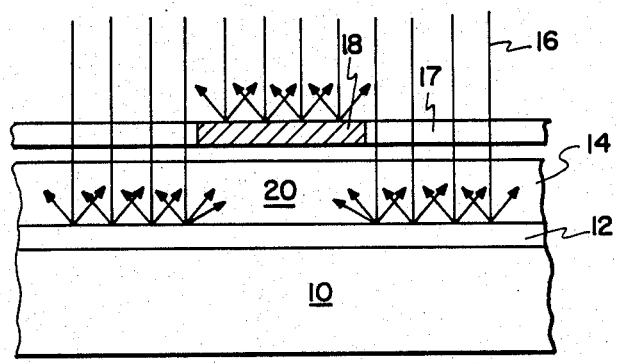
FIG. 1 illustrates the problems with typical prior art photoresist solutions.

The importance of the present invention is illustrated with reference to FIG. 1. Shown is a cross-section of a semiconductor substrate 10 under a metal layer 12 such as aluminum. A layer of photoresist 14 covers the aluminum layer. A clear glass plate 17 with a light blocking pattern 18 on it is used as a mask for patterning the photoresist layer.

The pattern on the mask is to be the final pattern of the aluminum. This is accomplished by using photoresist 14 as a pattern transfer layer. Pattern 18 on the mask is transferred to the photoresist by exposing the photoresist through the mask. The photoresist is then developed, and this process washes away the exposed resist, the objective being to leave the unexposed resist in an exact reproduction of the pattern on the mask. This pattern is then transferred into the underlying metal, e.g., aluminum, typically by subjecting the substrate to a ionized plasma which removes metal not protected by the photoresist. The photoresist is then removed, which leaves the aluminum or other metal on the substrate, preferably patterned the same as the original image on the mask.

When ultraviolet radiation 16 is used to expose photoresist layer 14, prior art reflection problems can cause the area under mask 18 to expose the photoresist in area 20. This is undesirable since the exposed photoresist in area 20 will be removed in subsequent processing. Further, since as explained above the photoresist acts as the pattern transfer medium in transferring the pattern on the mask to aluminum or other metal 12, the final metal pattern will not be the designed one, and device failure will result. The present invention solves this problem by substantially eliminating the prior art reflection problem.

In addition to solving reflection problems, the present invention concurrently addresses a related problem of alignment. Pattern 18 on the mask must be aligned to an exact lateral position over substrate 10. This process involves matching an alignment target (not shown) on the substrate with one on the glass. For this alignment to be accurate, the target on the substrate must be clearly visible at the wavelength of light used for exposure. For the target to be clearly visible, the amount of dye in the photoresist must be kept low. However, the amount of dye must also at the same time be high enough so that it prevents reflection problems from occurring. Therefore, in the preferred composition of the present invention, the amount of dye had to be carefully chosen to satisfy both of these requirements.

Accordingly, in seeking the preferred formulation of the present invention, the amount of the dye mixture in the photoresist had to be optimized so that the wavelength of light used to align wafers could be the same as that used to expose them. A formulation was found which enhanced absorption of light at a particular wavelength in order to substantially eliminate reflection during photoresist exposure while transmitting sufficient light at the particular wavelength in order to permit alignment using light at the particular wavelength. The wavelength chosen for the present invention was 436 nm, which is a peak wavelength of a mercury vapor light source used on many aligner systems.

The final formula developed for optimum antireflection of 436 nm light was 1.6 grams of Methyl Red dye and 0.6 grams of Sudan Orange G dye in 250 ml of compatible photoresist. While this is the formula of the preferred embodiment, it is contemplated that a broader range of concentrations, e.g., 1.4–1.8 grams of Methyl Red dye and 0.5–0.7 grams of Sudan Orange G dye in 250 ml of compatible photoresist, would also provide acceptable performance.

Figure 2:
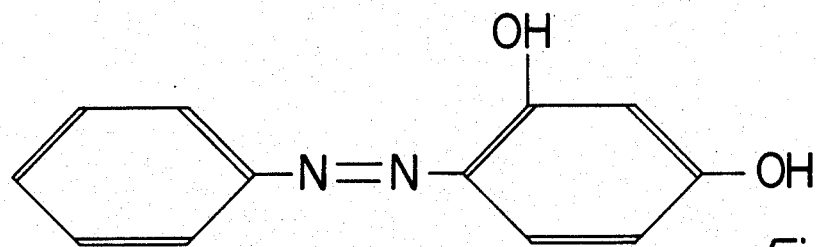
FIGS. 2 and 3 illustrate the chemical composition of Sudan Orange G and Methyl Red respectively.
Figure 3:
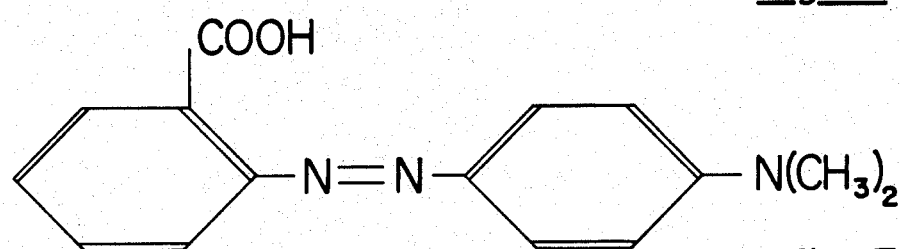

The chemical name for Sudan Orange G is 4-(Phenylazo) resorcinol which is illustrated in FIG. 2. The chemical name for Methyl Red is 2-(P-(dimethylamino) phenylazo) benzoic acid which is illustrated in FIG. 3.

The formulation is simply combined and mixed. Upon stirring, it is ready for use. A variety of conventional photoresists can be used in the formula. Both AZ 1450J manufactured by Shipley Company, Inc., Newton, Mass. 02162, and and KTI 820 manufactured by KTI Chemicals Incorporated, a subsidiary of Union Carbide Corp., Sunnyvale, Calif. 94086-5385.

Both of the above resists are typical novolac resin-based photoresists using conventional photosensitive materials and solvents. Novolac resins, of course, are well-known thermoplastic phenol-formaldehyde resins. The Shipley 1450J contains a blend of phenol-formaldehyde resins and photosensitive compounds in 2-ethoxyacetate, n-butylacetate and xylene. The KTI 820 photoresists contains phenyl-formaldehyde resin and photoactive compounds in 2-ethoxyethyl acetate and 4-butyrolactone. The utility of these and similar photoresists with respect to the blended mixtures of the present invention will occur to those skilled in the art.

The photosensitive and photactive ingredient as described above is a photosensitive o-quinone diazide compound such as a naphthoquinone (1,2)-diazide sulfonic acid ester.

The preferred mixture of the present invention allows resolution of three micron line-space pairs over metalized silicon wafers with non-flat topography.

Figure 4:
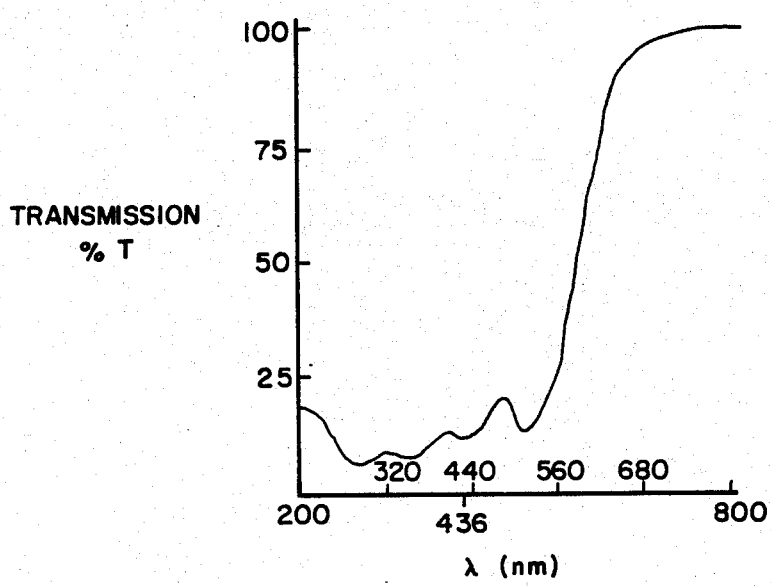
FIG. 4 illustrates the percent transmission of light versus wavelength for the preferred composition of the present invention.
Figure 5:
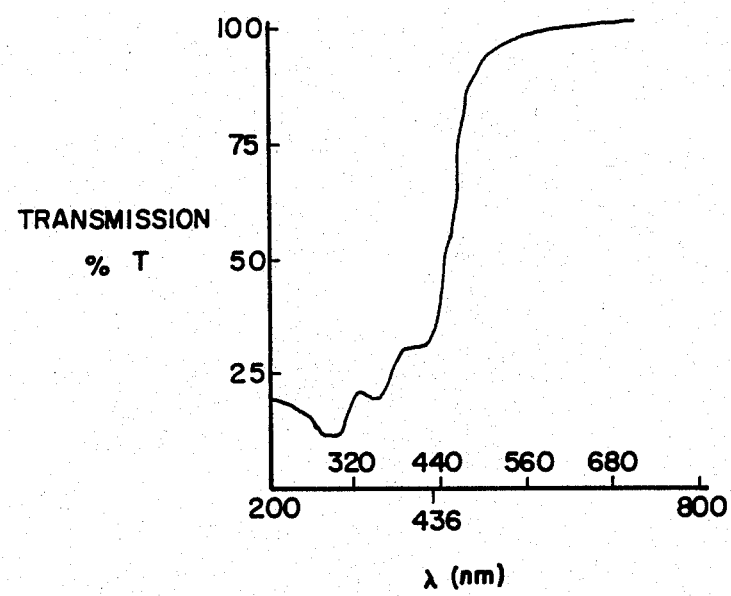
FIG. 5 illustrates the percent transmission of light versus wavelength for a standard photoresist without reflection limiting additives.

FIG. 4 shows the percent transmission of light with the preferred formulation of the present invention. FIG. 5 shows the percent transmission of a conventional photoresist without the reflection limiting additives.

A key to success of the present invention was the use of both Methyl Red and Sudan Orange G in the formula. Had only one of the dyes been used, a higher concentration would have been needed to achieve sufficient absorption. However, at such higher concentrations of a single dye, the dye recrystalized, thus preventing normal photoresist processing. With use of the two separate dyes, the total concentration within the photoresist is high enough to prevent reflections, and the two different dyes do not recrystalize together using the preferred formula. This made the final solution to the preferred formula much more difficult to obtain, since the dyes had to be different yet compatible and have similar properties. That is, the dyes had to be compatible with photoresist so that they did not degrade resolution, temperature stability, photosensitivity, or development characteristics; the dyes also had to absorb at a preferred wavelength of 436 nm; and the dyes had to be chosen so as not to contaminate or in any way adversely affect the subsequent processing of the silicon wafers.

The embodiments of the invention in which an exclusive property or right is claimed are defined as follows:

1. A reflection limiting photoresist consisting of a blend of approximately 1.4 to 1.6 g of Methyl Red dye and approximately 0.5 to 0.7 g of Sudan Orange dye in approximately 250 ml of a photoresist composition comprising a novolak resin and an o-quinone diazide compound such that the mixture enhances absorption of light at a particular wavelength in order to substantially eliminate reflections during photoresist exposure allows sufficient light transmission at the particular wavelength to permit mask alignment using light of the particular wavelength.

2. The reflection limiting photoresist of claim 1 wherein said blend formulation contains 1.6 g of Methyl Red dye and 0.6 g of Sudan Orange G dye.

3. The reflection limiting photoresist of claim 1 wherein said particular wavelength is 436 nm.

* * * * *